(12) United States Patent
Chiu

(10) Patent No.: US 11,894,484 B2
(45) Date of Patent: Feb. 6, 2024

(54) SOLAR CELL CHIP ARRANGEMENT MACHINE

(71) Applicant: Golden Solar (Quanzhou) New Energy Technology Co., Ltd., Quanzhou (CN)

(72) Inventor: Hsin-wang Chiu, Quanzhou (CN)

(73) Assignee: GOLDEN SOLAR (QUANZHOU) NEW ENERGY TECHNOLOGY CO., LTD., Quanzhou (CN)

( * ) Notice: Subject to any disclaimer, the term of this patent is extended or adjusted under 35 U.S.C. 154(b) by 325 days.

(21) Appl. No.: 17/455,020

(22) Filed: Nov. 16, 2021

(65) Prior Publication Data

US 2022/0320362 A1     Oct. 6, 2022

(30) Foreign Application Priority Data

Mar. 30, 2021 (CN) .......................... 202120637754.3

(51) Int. Cl.
  *H01L 31/18* (2006.01)
  *B26D 7/01* (2006.01)
  *H01M 10/04* (2006.01)

(52) U.S. Cl.
  CPC ............ *H01L 31/188* (2013.01); *B26D 7/015* (2013.01); *B26D 7/018* (2013.01); *H01L 31/1876* (2013.01); *H01M 10/0404* (2013.01)

(58) Field of Classification Search
  CPC .............. H01L 31/188; H01L 31/1876; H01M 10/0404; B26D 7/015; B26D 7/018; Y10T 156/1092; Y10T 156/1089; Y10T 156/1322; Y10T 156/133; B29C 65/7847; B29C 66/472
  See application file for complete search history.

(56) References Cited

U.S. PATENT DOCUMENTS

2002/0130394 A1     9/2002 Toyoda et al.

FOREIGN PATENT DOCUMENTS

| CN | 106914993 A | 7/2017 | |
|----|-------------|--------|---|
| CN | 206393062 U | 8/2017 | |
| CN | 107452836 A | * 12/2017 | ......... H01L 31/1876 |
| CN | 207781557 U | 8/2018 | |
| CN | 109326814 A | * 2/2019 | |
| CN | 110350046 A | 10/2019 | |
| CN | 110695538 A | 1/2020 | |

(Continued)

*Primary Examiner* — John L Goff, II

(74) *Attorney, Agent, or Firm* — Bayramoglu Law Offices LLC

(57) ABSTRACT

A solar cell chip arrangement machine includes a feeding mechanism and a slicing mechanism. The feeding mechanism includes a whole battery piece. A push block is connected to the back of the whole battery piece, and a pressing plate is arranged above the front of the whole battery piece. The slicing mechanism is arranged on the pressing plate above the front of the whole battery piece. The slicing mechanism includes a vacuum sucker, a guide plate, a guide plate slide rail, a positioning block, a positioning block slide rail, a cylinder, a fixed plate, and a vacuum generator. The positioning block is arranged on the positioning block slide rail, a pulley is arranged on the positioning block, and the guide plate is provided with a limit slot corresponding to the pulley. The vacuum sucker is arranged on the positioning block, and the vacuum sucker is connected to the vacuum generator.

4 Claims, 8 Drawing Sheets

(56) References Cited

FOREIGN PATENT DOCUMENTS

| | | |
|---|---|---|
| CN | 209929329 U | 1/2020 |
| CN | 111192939 A | 5/2020 |
| CN | 111203661 A | 5/2020 |
| CN | 111613560 A | 9/2020 |
| CN | 112510119 A | 3/2021 |
| CN | 215266337 U | 12/2021 |

\* cited by examiner

SOLAR CELL CHIP ARRANGEMENT MACHINE

CROSS REFERENCE TO THE RELATED APPLICATIONS

This application is based upon and claims priority to Chinese Patent Application No. 202120637754.3, filed on Mar. 30, 2021, the entire contents of which are incorporated herein by reference.

TECHNICAL FIELD

The present invention relates to the technical field of the solar cell equipment, and more particularly, to a solar cell chip arrangement machine.

BACKGROUND

The first generation of silicon-based flexible battery solves the problem that the battery is liable to crack in the process of bending and rolling of flexible solar module, to make the silicon-based battery realize the real flexible and rollable function. However, in the manufacturing method of the first generation of silicon-based flexible battery, a laser cutting machine is used to perform scribing, and the scribed large silicon-based battery is split into small battery pieces by a splitting machine. Through the chip automatic arrangement machine, the small battery pieces are arranged on the fixture that is pre-arranged with flexible printed circuit board (FPCB), and after welding the positive electrode or negative electrode of the first FPCB, the second FPCB is arranged on the other electrode of the chip to be welded, and then the surface of the welded small battery piece is fitted with the protective layer by dripping adhesive. It can be seen that the above manufacturing process is more complex and has many processes, resulting in low automation efficiency.

SUMMARY

In view of the above problems, the present invention provides a solar cell chip arrangement machine, which integrates the chip slicing and the chip arrangement in the same process to reduce the number of processes, and to improve the production efficiency.

In order to solve the above problems, the technical solution adopted by the present invention is as follows. A solar cell chip arrangement machine includes a feeding mechanism and a slicing mechanism. The feeding mechanism includes a whole battery piece. A push block controlled by a servo motor is connected to the back of the whole battery piece, and a pressing plate is arranged above the front of the whole battery piece. The slicing mechanism is arranged on the pressing plate above the front of the whole battery piece. The slicing mechanism includes a vacuum sucker, a guide plate, a guide plate slide rail, a positioning block, a positioning block slide rail, a cylinder, a fixed plate, and a vacuum generator. The guide plate and the guide plate slide rail are arranged on the fixed plate, and the number of the guide plate slide rail is two. The positioning block is arranged on the positioning block slide rail, a pulley is arranged on the positioning block, and the guide plate is provided with a limit slot corresponding to the pulley. The vacuum sucker is arranged on the positioning block, and the vacuum sucker is connected to the vacuum generator. A front end of the slicing mechanism is provided with a low-viscosity tape. An end of the low-viscosity tape is connected to a tape chuck, and a cutter is arranged above the end of the low-viscosity tape connected to the tape chuck.

Further, the whole battery piece is formed by a method that a whole back-contact solar battery piece and a same-size hard protective layer are scribed by a laser cutting machine, and then fitted with each other by dripping adhesive.

Further, the slicing mechanism is mounted on a screw guide rail, and the screw guide rail is driven by a driving motor to drive the slicing mechanism to move forward and backward, or left and right, or upward and downward.

Further, the positioning block moves left and right along the positioning block slide rail at a distance of 0.2-0.3 mm.

From the above description of the structure of the present invention, compared with the prior art, the present invention has the following advantages.

1. Compared with the manufacturing process of the first generation flexible battery where the silicon-based solar cell chip is first cut into small pieces and then the hard protective layer is fitted by dripping adhesive after the positive electrode side and the negative electrode side are respectively welded with FPCB, according to the present invention, the back-contact solar cell is not directly sliced after the whole chip piece and the whole protective layer piece are scribed, but the adhesive is dripped first, so that the scribed chip and the scribed hard protective layer are first fitted with each other and then sliced, thereby greatly reducing the number of grabbing process. The chip slicing and the chip arrangement are integrated in one process, which simplifies the preparation process. Since the no-sliced chip has a regular distribution, multiple chips can be grabbed at one time and arranged at the same time, so as to improve the process automation and work efficiency.

2. The structure design of the slicing mechanism of the solar cell chip arrangement machine of the present invention uses the guide plate to guide the positioning block to reciprocate left and right along the slide rails to realize the positioning arrangement of the chips, and the positioning block adopts double slide rails for positioning to achieve the high precision and stability of displacement.

BRIEF DESCRIPTION OF THE DRAWINGS

The drawings, as a part of the present application, are used to provide further understanding of the present invention, and the schematic embodiments of the present invention and the description thereof are used to explain the present invention and do not constitute an undue limitation of the present invention. In the drawings.

Figure 1:
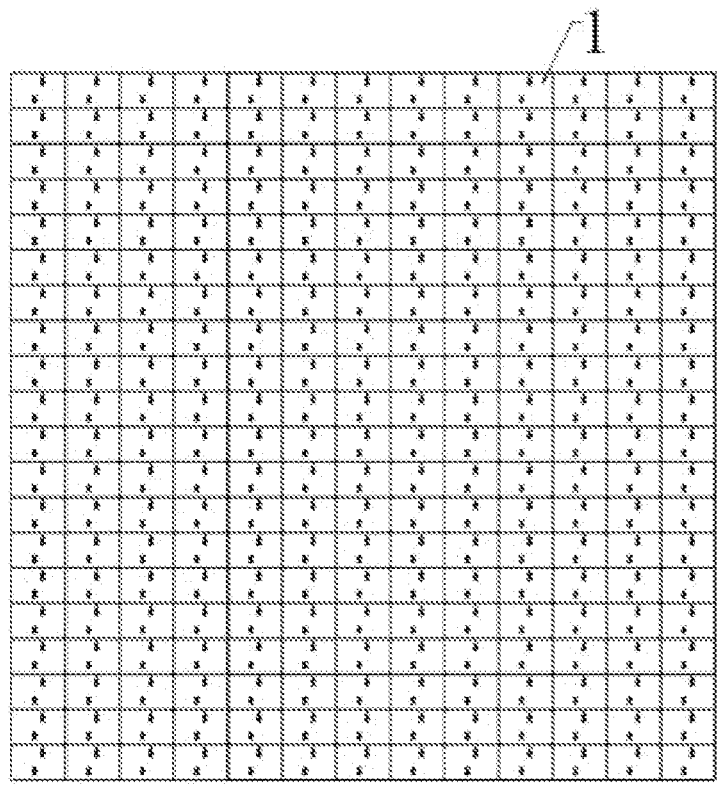
FIG. 1 is a schematic diagram of the structure of a whole battery piece of the present invention.

In the figures: whole battery piece 1; a row of small cell chips 2; push block 3; pressing plate 4; vacuum sucker 5; guide plate 6; pulley 7; low-viscosity tape 8; tape chuck 9; small cell chip string 10; guide plate slide rail 11; positioning block 12; positioning block slide rail 13; cylinder 14; fixed plate 15; vacuum generator 16; cutter 17; limit slot 18; screw guide rail 19; driving motor 20; small battery pack 100.

DETAILED DESCRIPTION OF THE EMBODIMENTS

In order to make the objective, the technical solution, and the advantages of the present invention clearer, the present invention is further explained in detail below in combination with the drawings and the embodiments. It should be understood that the specific embodiments described herein are only used to explain the present invention and are not used to limit the present invention.

Embodiment

Figure 2:
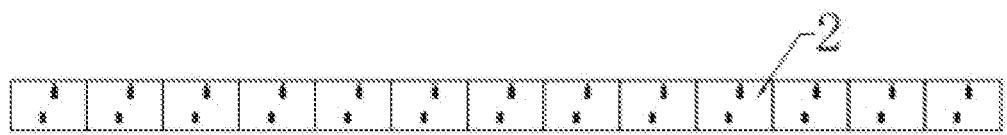
FIG. 2 is a schematic diagram of the structure of a row of small cell chips of the present invention.
Figure 3:
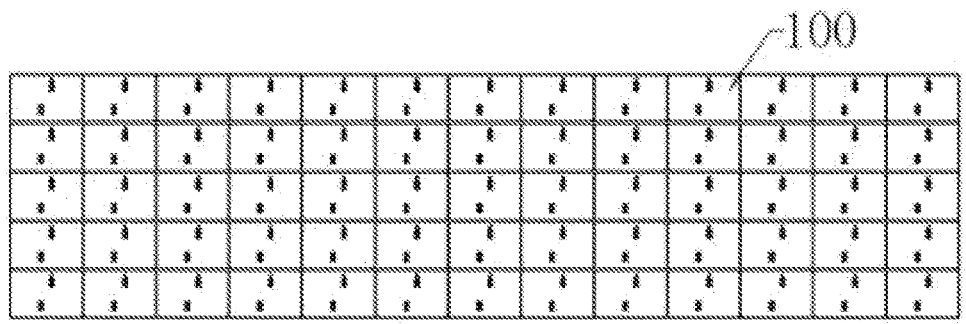
FIG. 3 is a schematic diagram of the structure of a small battery pack of the present invention.
Figure 4:
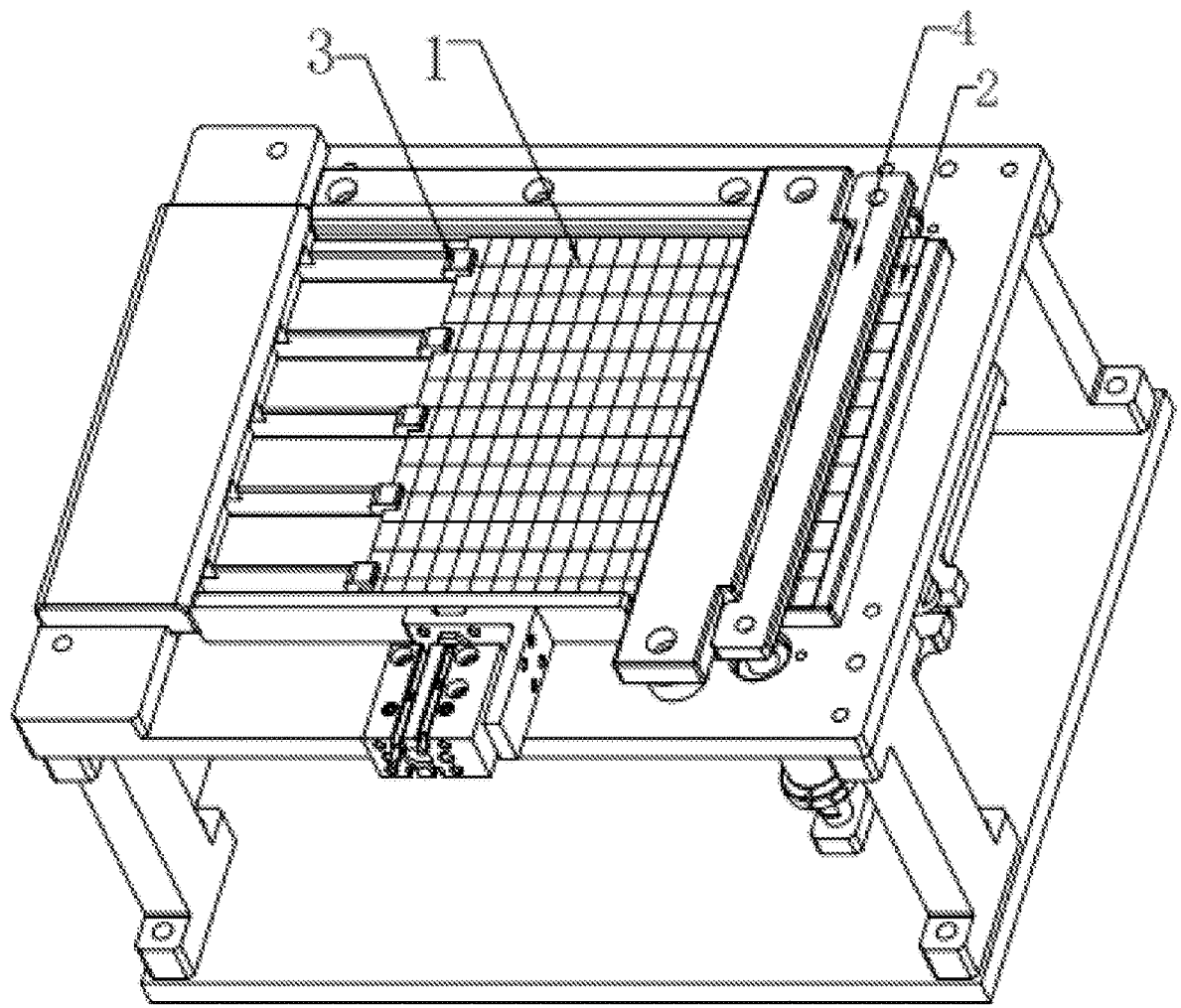
FIG. 4 is a schematic diagram of the structure of a feeding mechanism of the present invention.
Figure 5:
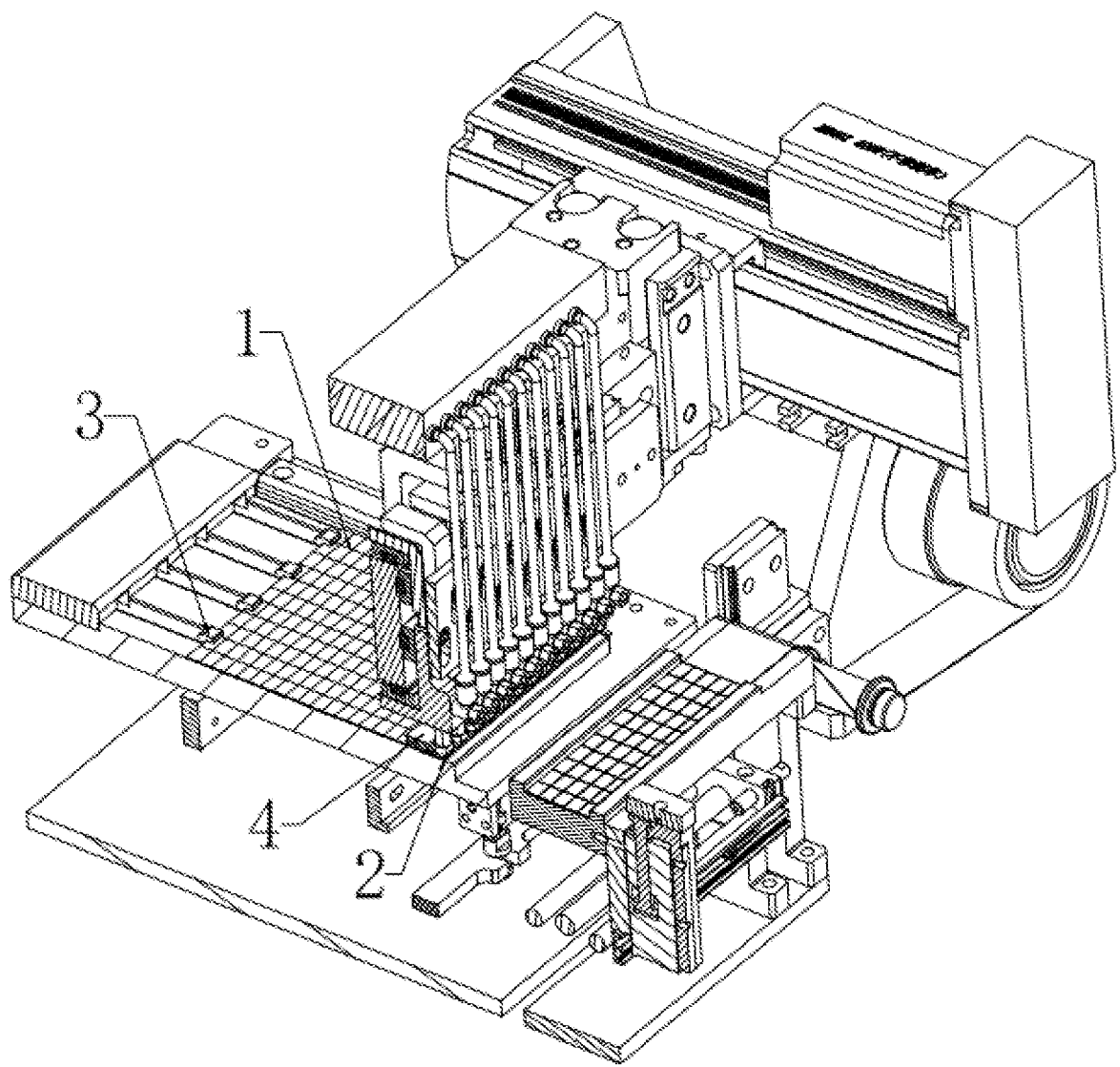
FIG. 5 is a cross-sectional schematic diagram of the structure of the feeding mechanism of the present invention.
Figure 6:
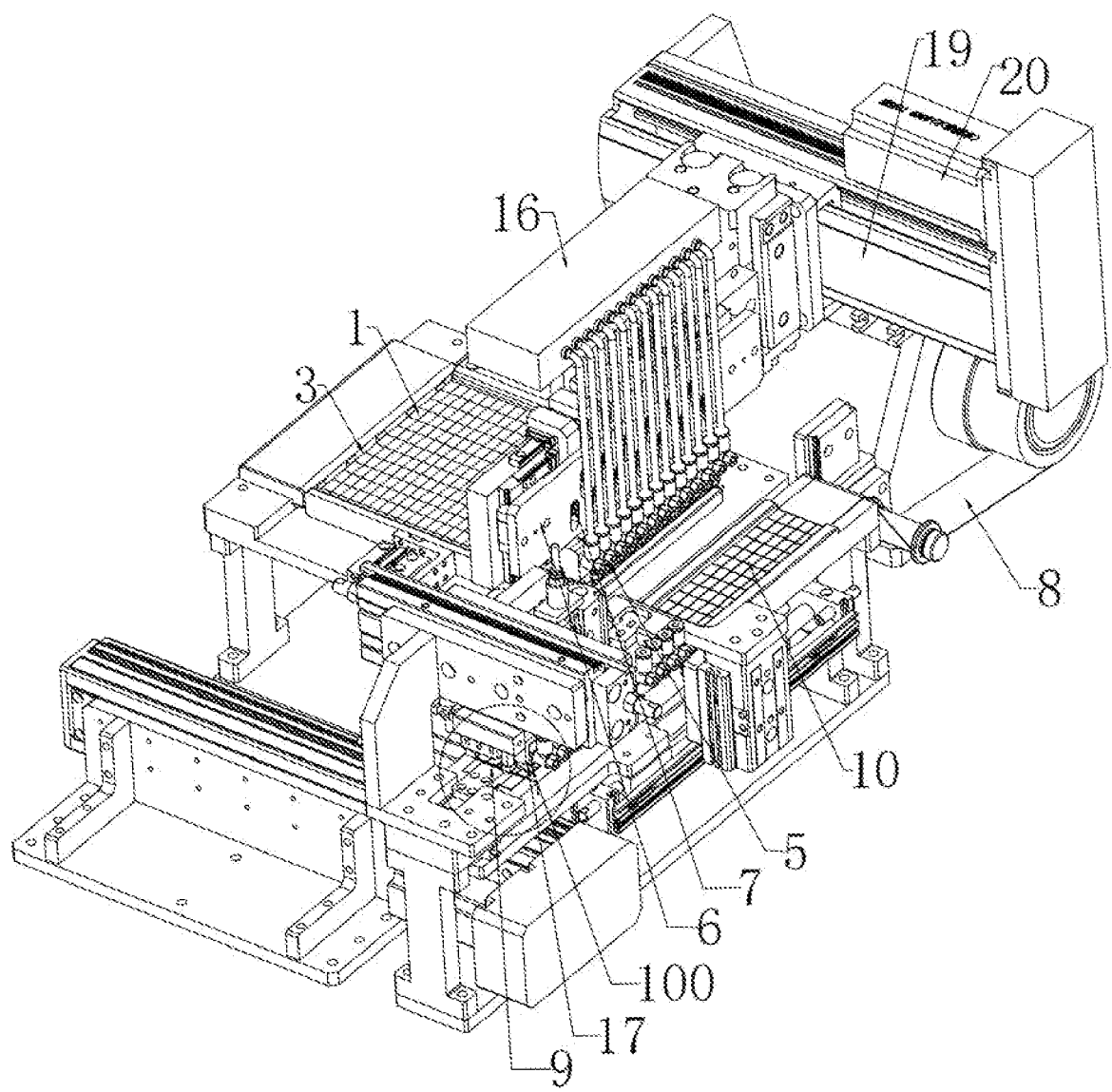
FIG. 6 is a schematic diagram of the overall structure of the present invention.
Figure 7:
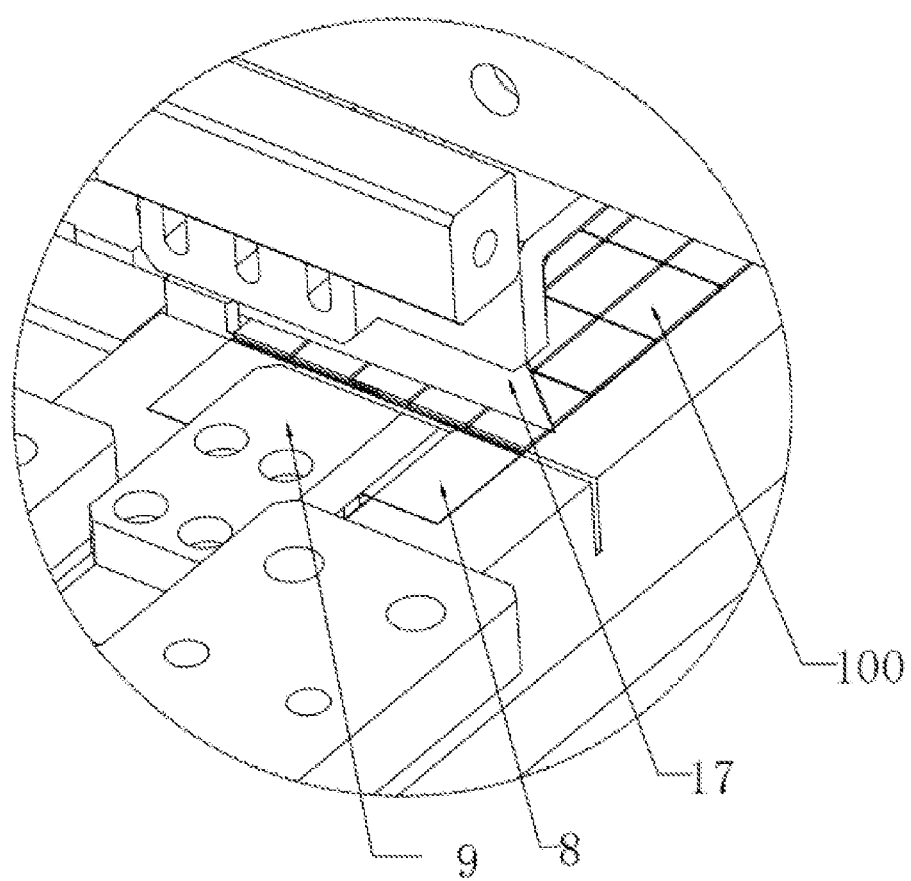
FIG. 7 is a partially enlarged schematic diagram of the cutting part of the present invention.
Figure 8:
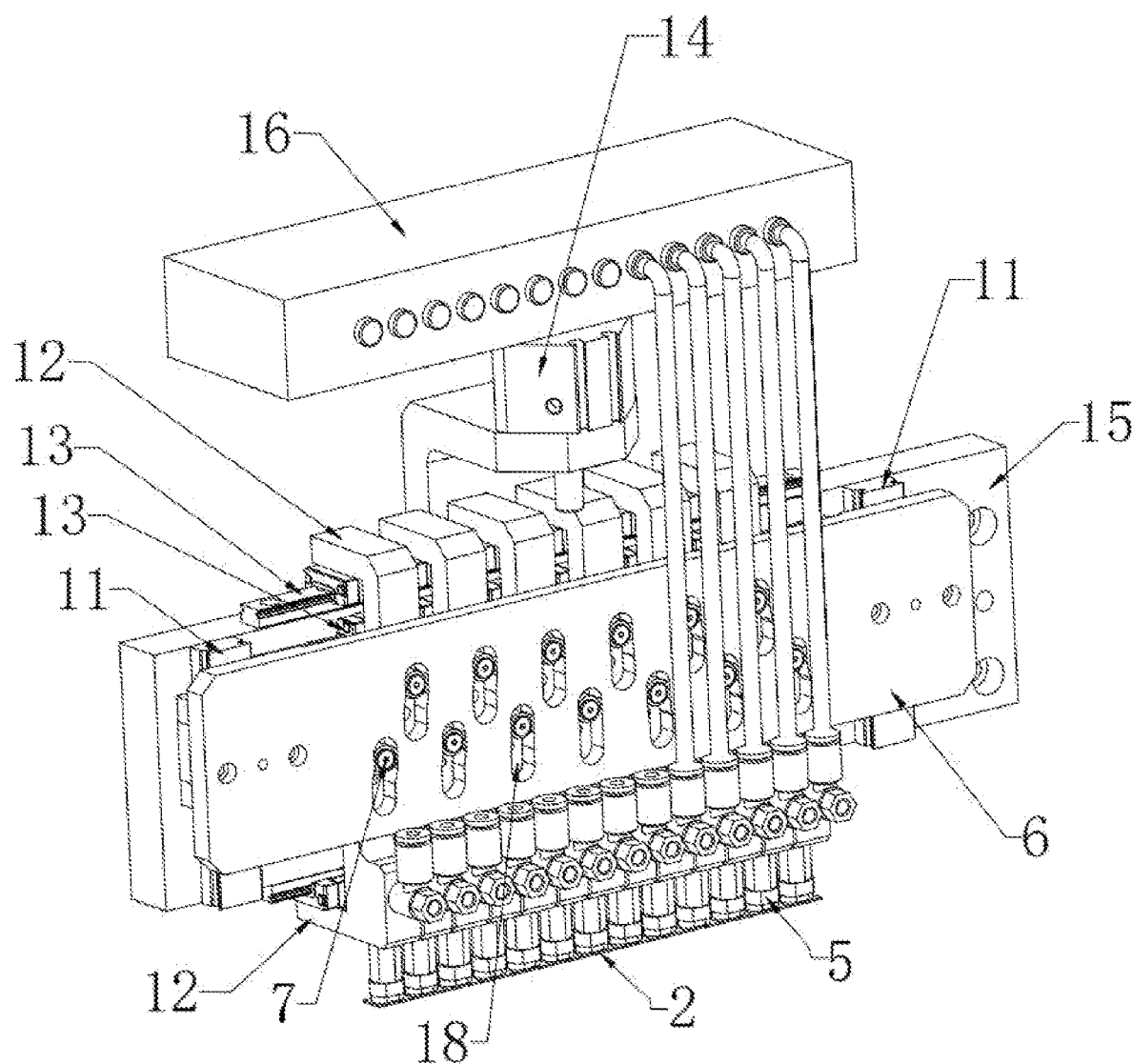
FIG. 8 is a schematic diagram of the structure of a slicing mechanism of the present invention.
Figure 9:
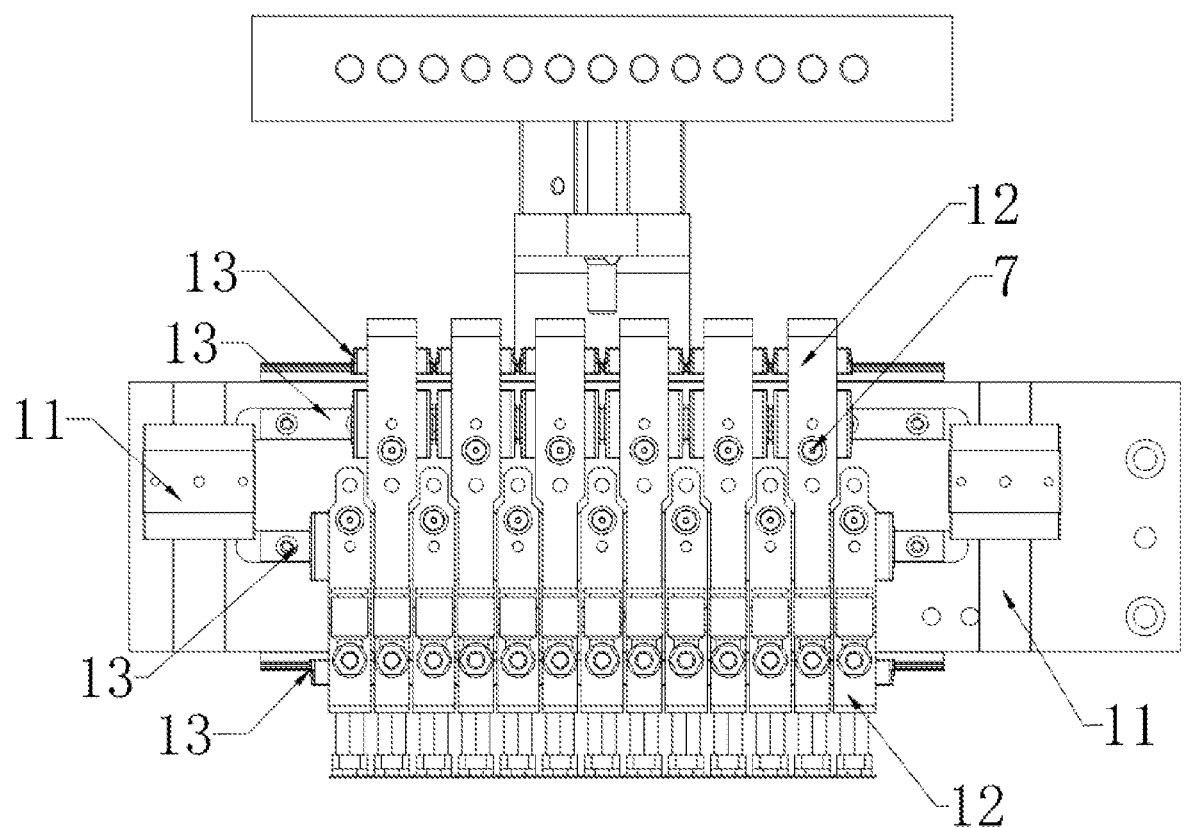
FIG. 9 is a schematic diagram of the internal structure of the slicing mechanism of the present invention.
Figure 10:
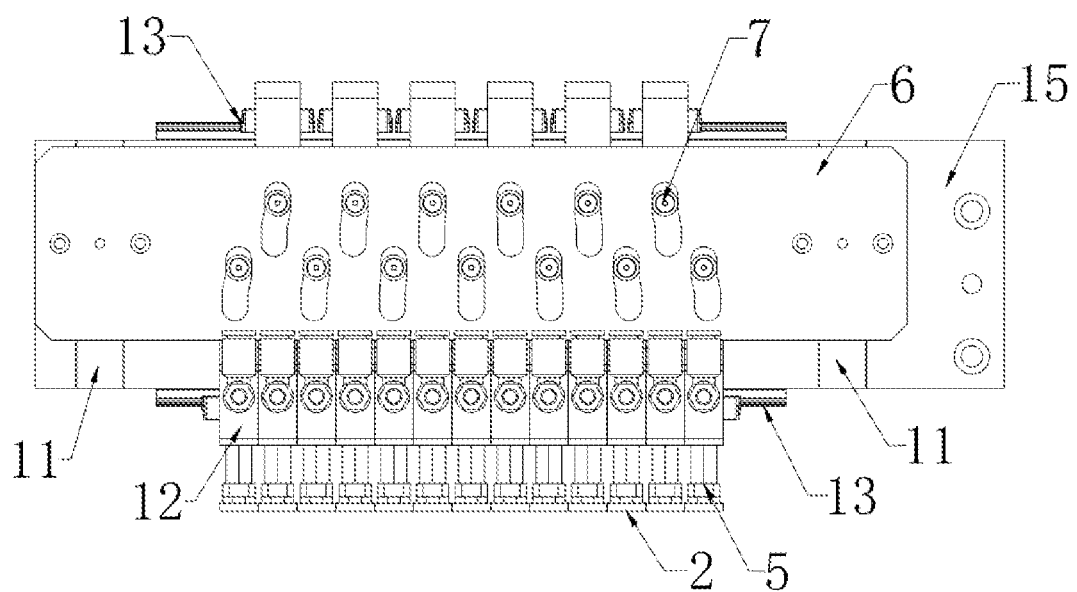
FIG. 10 is a schematic diagram of the structure of the slicing mechanism of the present invention in a process of grabbing a row of small cell chips.
Figure 11:
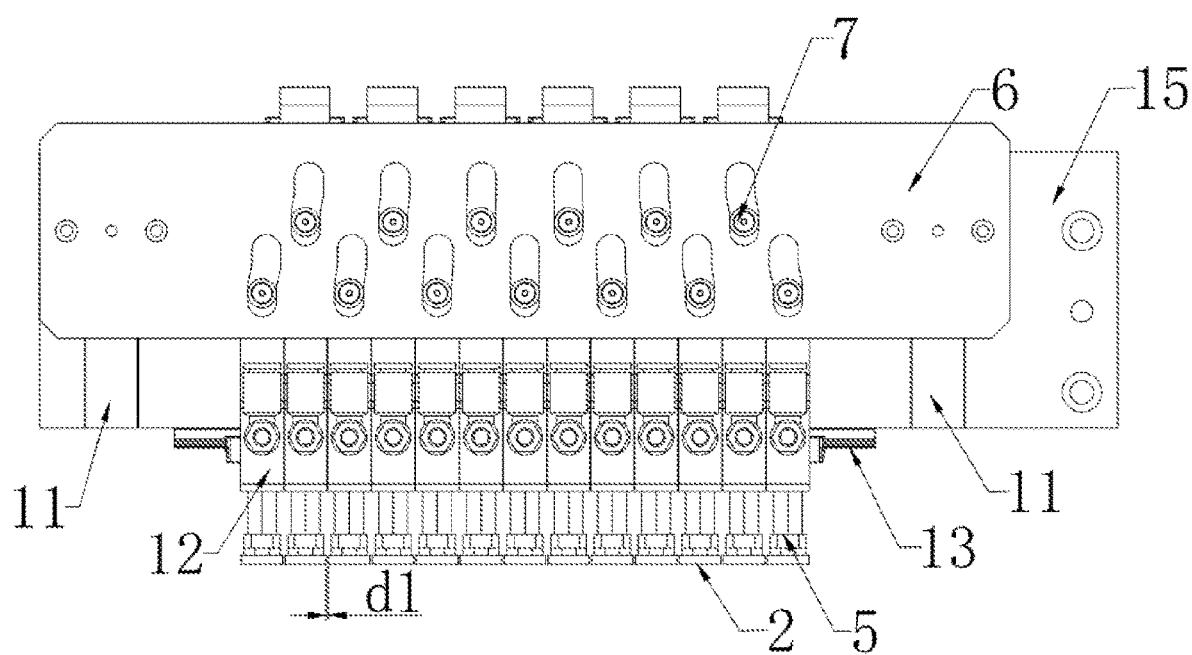
FIG. 11 is a schematic diagram of the structure of the slicing mechanism of the present invention after slicing.

Referring to FIGS. 1-11, a solar cell chip arrangement machine includes a feeding mechanism and a slicing mechanism. The feeding mechanism includes the whole battery piece 1. The whole battery piece 1 is formed by a method that a whole back-contact solar battery piece and a same-size hard protective layer are scribed by a laser cutting machine, and then fitted with each other by dripping adhesive. The push block 3 controlled by a servo motor is connected to the back of the whole battery piece 1, and the pressing plate 4 is arranged above the front of the whole battery piece 1. The slicing mechanism is arranged on the pressing plate 4 above the front of the whole battery piece 1. The slicing mechanism is mounted on the screw guide rail 19, and the screw guide rail 19 is driven by the driving motor 20 to drive the slicing mechanism to move forward and backward, or left and right, or upward and downward. The slicing mechanism includes the vacuum sucker 5, the guide plate 6, the guide plate slide rail 11, the positioning block 12, the positioning block slide rail 13, the cylinder 14, the fixed plate 15, and the vacuum generator 16. The guide plate 6 and the guide plate slide rail 11 are arranged on the fixed plate 15, and the number of the guide plate slide rail 11 is two. The positioning block 12 is arranged on the positioning block slide rail 13, the pulley 7 is arranged on the positioning block 12, the guide plate 6 is provided with the limit slot 18 corresponding to the pulley 7. The positioning block 12 is limited by the limit slot 18 to move left and right along the positioning block slide rail 13 at the distance of 0.2-0.3 mm. The vacuum sucker 5 is arranged on the positioning block 12, and the vacuum sucker 5 is connected to the vacuum generator 16. The front end of the slicing mechanism is provided with the low-viscosity tape 8. An end of the low-viscosity tape 8 is connected to the tape chuck 9, and the cutter 17 is arranged above the end of the low-viscosity tape 8 connected to the tape chuck 9.

The working principle of the present invention is as follows. The whole battery piece 1 is formed by a method that the whole back-contact solar battery piece and the same-size hard protective layer are scribed by the laser cutting machine (Each divided into 13×20 pieces), and then fitted with each other by dripping adhesive. The whole battery piece 1 is split by the splitting mechanism and then is grabbed by the automatic mechanical arm to be put into the feeding mechanism of the automatic slicing arrangement machine. The push block 3 located on the back of the whole battery piece 1 and controlled by the servo motor drives the chip to move forward one section once, the vacuum sucker 5 (in a row of thirteen) of the slicing mechanism sucks up a row of small cell chips 2 once, and the pressing plate 4 located on the front of the whole battery piece 1 presses the whole battery piece 1 so as not to be picked up together. The guide plate 6 is controlled and lifted up by the cylinder 14. The track of the pulley 7 is controlled by the nozzle positioning block 12 of the guide plate 6 to move outward, and the vacuum sucker 5 sucks up the row of small cell chips 2. The cylinder 14 works to control the guide plate to move upward to drive the pulley 7 on the positioning block 12 to move in a wide direction along the limit slot of the guide plate 6, and the positioning block 12 moves left and right along the positioning block slide rail 13 to expand the distance between chips by 0.2 mm. While slicing, the slicing mechanism moves from the driving motor to the position of the low-viscosity tape 8, and then the air pressure is disconnected so that the chips are arranged on the low-viscosity tape 8. After the arrangement, the cylinder 14 moves down to drive the guide plate 6 down to the original position, and the positioning block 12 is driven by the guide plate 6 to return to the position where the spacing is not expanded. The action of absorbing the chips is repeated until each arrangement of five rows forms the small cell chip string 10, then the tape chuck 9 pulls the low-viscosity tape to move a component station, and the cutter 17 cuts the low-viscosity tape to form the small battery pack 100.

Compared with the manufacturing process of the first generation flexible battery where the silicon-based solar cell chip is first cut into small pieces and then the hard protective layer is fitted by dripping adhesive after the positive electrode side and the negative electrode side are respectively welded with FPCB, according to the present invention, the back-contact solar cell is not directly sliced after the whole chip piece and the whole protective layer piece are scribed, but the adhesive is dripped first, so that the scribed chip and the scribed hard protective layer are first fitted with each other and then sliced, thereby greatly reducing the number of grabbing process. The chip slicing and the chip arrangement are integrated in one process, which simplifies the preparation process. Since the no-sliced chip has a regular distribution, multiple chips can be grabbed at one time and arranged at the same time, so as to improve the process automation and work efficiency.

The structure design of the slicing mechanism of the solar cell chip arrangement machine of the present invention uses the guide plate to guide the positioning block to reciprocate left and right along the slide rails to realize the positioning arrangement of the chips, and the positioning block adopts double slide rails for positioning to achieve the high precision and stability of displacement.

The above only describes preferred embodiments of the present invention and are not used to limit the present invention. Any modifications, equivalent replacements, and improvements made within the spirit and principles of the present invention shall fall within the scope of protection of the present invention.

What is claimed is:

1. A solar cell chip arrangement machine, comprising a feeding mechanism and a slicing mechanism, wherein the feeding mechanism comprises a whole battery piece; a push block controlled by a servo motor is connected to a back of the whole battery piece, and a pressing plate is arranged above a front of the whole battery piece; the slicing mechanism is arranged on the pressing plate above the front of the whole battery piece; the slicing mechanism comprises a vacuum sucker, a guide plate, a guide plate slide rail, a positioning block, a positioning block slide rail, a cylinder, a fixed plate, and a vacuum generator; the guide plate and the guide plate slide rail are arranged on the fixed plate, and a number of the guide plate slide rail is two; the positioning block is arranged on the positioning block slide rail, a pulley is arranged on the positioning block, and the guide plate is provided with a limit slot corresponding to the pulley; the vacuum sucker is arranged on the positioning block, and the vacuum sucker is connected to the vacuum generator; a front end of the slicing mechanism is provided with a tape; an end of the tape is connected to a tape chuck, and a cutter is arranged above the end of the tape connected to the tape chuck.

2. The solar cell chip arrangement machine according to claim 1, wherein the whole battery piece is formed by a method, and the method comprises scribing a whole back-contact solar battery piece and a same-size hard protective layer by a laser cutting machine, and then fitting with each other by dripping adhesive.

3. The solar cell chip arrangement machine according to claim 1, wherein the slicing mechanism is mounted on a screw guide rail, and the screw guide rail is driven by a driving motor to drive the slicing mechanism to move forward and backward, or left and right, or upward and downward.

4. The solar cell chip arrangement machine according to claim 1, wherein the positioning block moves left and right along the positioning block slide rail at a distance of 0.2-0.3 mm.

* * * * *